US008093644B2

(12) United States Patent
Yang (10) Patent No.: US 8,093,644 B2
(45) Date of Patent: Jan. 10, 2012

(54) MULTIWALLED CARBON NANOTUBE MEMORY DEVICE

(75) Inventor: Haining S. Yang, Wappingers Falls, NY (US)

(73) Assignee: Internationl Business Machines Corporation, Armonk, NY (US)

( * ) Notice: Subject to any disclaimer, the term of this patent is extended or adjusted under 35 U.S.C. 154(b) by 361 days.

(21) Appl. No.: 12/350,432

(22) Filed: Jan. 8, 2009

(65) Prior Publication Data
US 2009/0201743 A1    Aug. 13, 2009

Related U.S. Application Data

(63) Continuation of application No. 11/968,416, filed on Jan. 2, 2008, now Pat. No. 7,482,652.

(51) Int. Cl.
*H01L 21/00* (2006.01)

(52) U.S. Cl. ............... 257/314; 257/20; 257/23; 257/24; 257/183; 257/557; 257/E51.04; 257/E51.001; 257/E29.082; 438/50; 977/742; 977/939

(58) Field of Classification Search .................... 257/24, 257/20, 40, 183, 23, 557, 565, 255, 368, 257/E51.04, E51.001, E29.082, 197; 438/50; 977/742, 939

See application file for complete search history.

(56) References Cited

U.S. PATENT DOCUMENTS

| 2005/0199731 | A9* | 9/2005 | Empedocles et al. ......... 235/491 |
| 2006/0205105 | A1 | 9/2006 | Maruyama et al. |
| 2007/0014151 | A1 | 1/2007 | Zhang et al. |
| 2009/0075407 | A1* | 3/2009 | Maruyama et al. ............. 438/16 |

OTHER PUBLICATIONS

Avouris, P. et al., "Nanotube Electronics and Optoelectronics", Materials Today (2006), pp. 46-54, vol. 9(10), IBM Research Division, Yorktown Heights.
Avouris, P. et al., "Carbon Nanotube Electronics", Proceedings of the IEEE (2003), pp. 1772-1784, vol. 91(11), IBM Research Division, Yorktown Heights.
Bourlon, B. et al., "Determination of the Intershell Conductance in Multiwalled Carbon Nanotubes", Physical Review Letters (Oct. 22, 2004), pp. 176806:1-176806:4, vol. 93(17), The American Physical Society.
Lai, King W.C. et al., "Development of an Automated Microspotting System for Rapid Dielectrophoretic Fabrication of Bundled Carbon Nanotube Sensors", IEEE Transactions on Automation Science and Engineering (2006), vol. 3(3), IEEE.

(Continued)

*Primary Examiner* — A. Sefer
*Assistant Examiner* — Ermias Woldegeorgis
(74) *Attorney, Agent, or Firm* — Scully, Scott, Murphy & Presser, P.C.; H. Daniel Schnurmann (57) ABSTRACT

A carbon nanotube based memory device comprises a set of three concentric carbon nanotubes having different diameters. The diameters of the three concentric carbon nanotubes are selected such that an inner carbon nanotube is semiconducting, and intershell electron transport occurs between adjacent carbon nanotubes. Source and drain contacts are made to the inner carbon nanotube, and a gate contact is made to the outer carbon nanotube. The carbon nanotube based memory device is programmed by storing electrons or holes in the middle carbon nanotube through intershell electron transport. Changes in conductance of the inner carbon nanotube due to the charge in the middle shell are detected to determine the charge state of the middle carbon nanotube. Thus, the carbon nanotube based memory device stores information in the middle carbon nanotube in the form of electrical charge.

20 Claims, 11 Drawing Sheets

OTHER PUBLICATIONS

Lee, Y. et al., "Field Emissions Properties of Screen Printed Double-Walled Carbon Nanotubes Synthesized by Thermal CVD", IEEE (2004).

Liu, P. et al., "Peeling and Cutting a Multi-Walled Carbon Nanotube Inside a Scanning Electron Microscope", Proceedings of the 2nd IEEE International Conference on Nano/Micro Engineered and Molecular Systems (Jan. 16-19, 2007), pp. 286-289.

Pennington, G. et al., "Semiclassical Transport and Phonon Scattering of Electrons in Semiconducting Carbon Nanotubes", Physical Review B 68 (2003) pp. 045426:1-045426:11, The American Physical Society.

* cited by examiner

MULTIWALLED CARBON NANOTUBE MEMORY DEVICE

RELATED APPLICATIONS

This application is a continuation of U.S. patent application Ser. No. 11/968,416, filed Jan. 2, 2008.

FIELD OF THE INVENTION

The present invention relates to a carbon nanotube structure, and particularly to a multiwalled carbon nanotube memory device and methods of manufacturing the same.

BACKGROUND OF THE INVENTION

As scaling for conventional CMOS integrated circuits approaches quantum mechanical limits, alternative nanostructures and materials have been investigated in the semiconductor industry. Of such nanostructures and materials, carbon nanotubes (CNTs) offer excellent intrinsic properties that are suitable for high performance nanoscale devices.

A key advantage of CNTs over conventional CMOS devices is that scaling limitations of MOSFETs due to boundary scattering of electrons from imperfect interfaces are solved naturally in CNTs which have a smooth, well coordinated graphene structure with no bonds to the outside. This enables CNTs to retain excellent transport properties to much smaller lateral dimensions than silicon. The small radius and possibility of completely surrounding the CNT by a gate provide excellent electrostatic confinement of channel electrons, enabling the channel length to be scaled down to very small dimensions, and their small size would enable high packing densities. Band structure calculations of CNTs according to P. Avouris and J. Chen, "Nanotube electronics and optoelectronics," Materials Today, Vol. 9, pp. 46-54, (2006) show that conduction and valence bands are mirror images of each other, i.e., both electrons and holes should share equally good transport properties. This indicates suitability of CNTs for a general-purpose high-performance complementary circuit technology.

As is now well known, CNTs can be either metallic or semimetallic, depending on their chirality and have a bandgap which is inversely proportional to their diameter for the semiconducting tubes. A useful relation, derived from tight binding calculations, between the diameter and the band gap, $E_g$ of a CNT is $$E_g = \gamma(2d_{C-C}/\sqrt{3}d_{CNT}), \quad \text{equation (1)}$$

where $\gamma$ is the hopping matrix element, $d_{C-C}$ is the C—C bond distance, and $d_{CNT}$ is the diameter of the carbon nanotube. Inclusion of electron-electron interactions raises the size of the bandgap, $E_g$ significantly. For a 1 nm nanotube, the band gap is roughly 1 eV. The best transport measurements and device characteristics have been obtained on rather large diameter nanotubes, with their diameter in the 1.7-3 nm range. The idealized electron/hole dispersion relation is hyperbolic in shape, with a quasi parabolic "effective mass" regime at lower energies and a linear "constant velocity" regime at higher energies, where the limiting velocity, $v_{lim}$, is $5\sim10\times10^7$ cm/sec according to G. Pennington and N. Goldsman, "Semiclassical transport and phonon scattering of electrons in semiconducting carbon nanotubes," Phys. Rev. B 68, 045426 (2003).

P. Avouris et al, "Carbon Nanotube Electronics," Proceedings of the IEEE, Vol. 91, No. 11, pp. 1772-1984, November (2003) discloses carbon nanotube field effect transistors, and compares the performance characteristics of the carbon nanotube field effect transistors with the performance characteristics of silicon based field effect transistors. Further, methods of forming carbon nanotube base integrated circuits are also disclosed.

Figure 1:
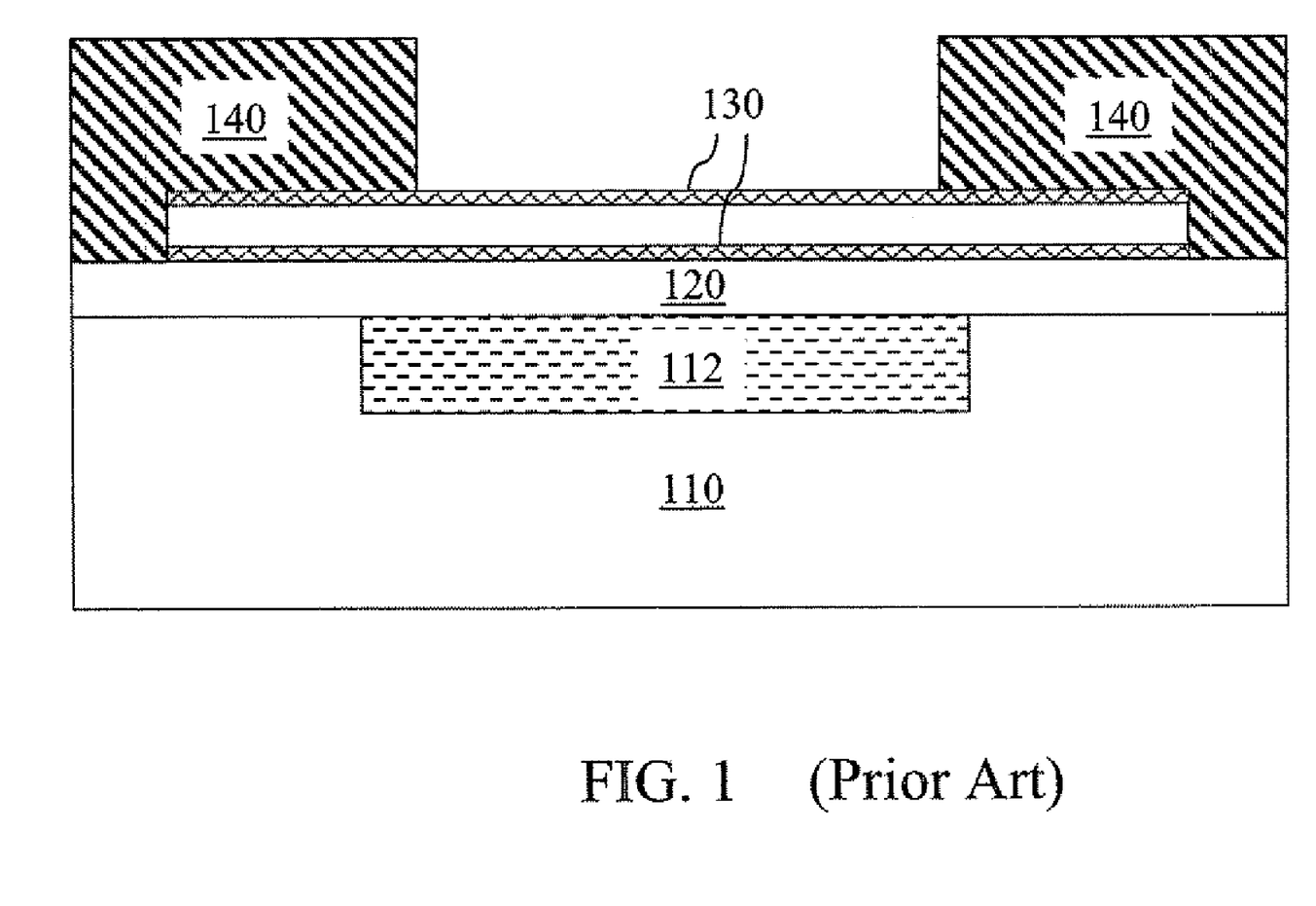
FIG. 1 is a vertical cross-sectional view of an exemplary prior art carbon nanotube transistor along a length of a carbon nanotube.

One application of a carbon nanotube is formation of a switching device employing the carbon nanotube in a field effect transistor structure. FIG. 1 shows a vertical cross-sectional view of an exemplary carbon nanotube field effect transistor according to P. Avouris et al. along a lengthwise direction of the carbon nanotube 130. The exemplary carbon nanotube field effect transistor includes a back gate dielectric layer 120 comprising silicon oxide, a back gate electrode 112 formed in a semiconductor substrate 110, and source and drain metal contacts 140. Optionally, a top gate dielectric layer (not shown) and a top gate electrode (not shown) may be additionally formed to control conduction of current along the carbon nanotube. The exemplary semiconductor device functions as an electronic switch in the same manner as a semiconductor based field effect transistor.

Figure 2:
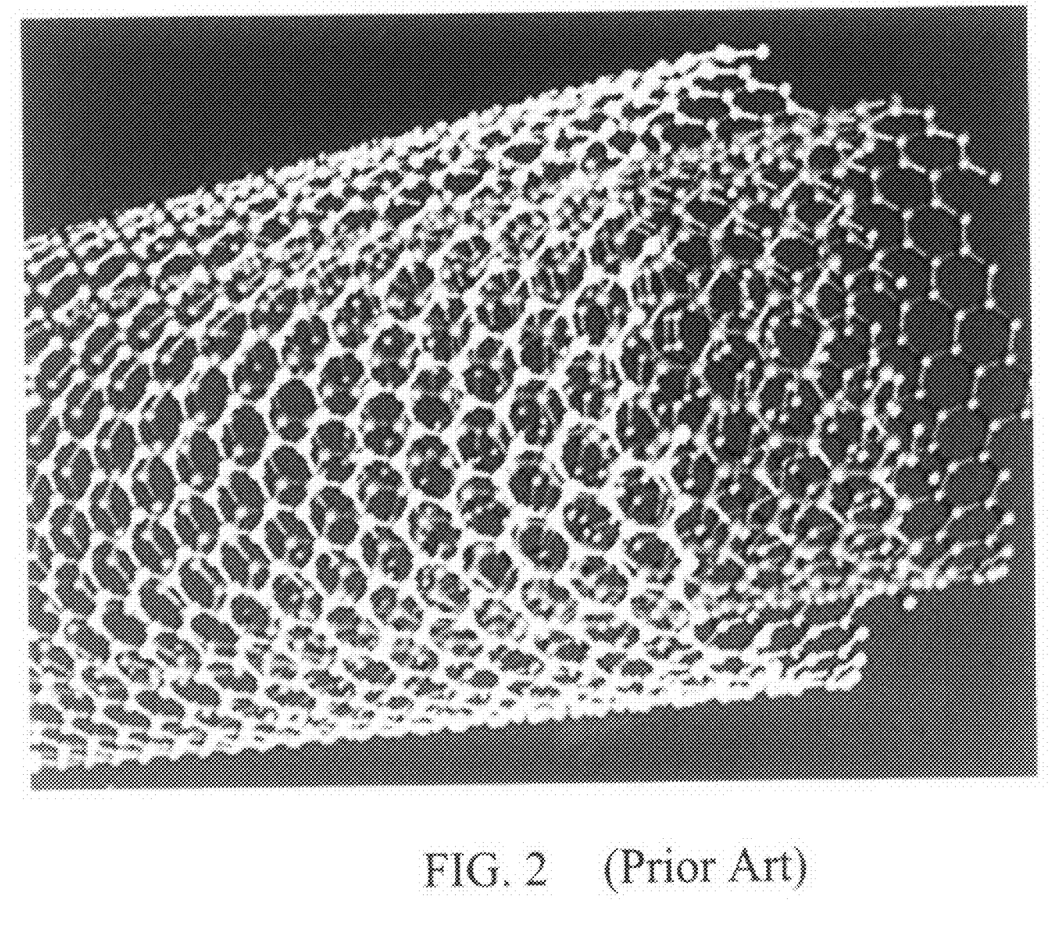
FIG. 2 is a view of a three dimensional model of a multiwall carbon nanotube structure having two shells, i.e., two nested carbon nanotubes.

Multiwalled carbon nanotubes, which contain multiple concentric carbon nanotubes having different diameters, are also known in the art. FIG. 2 shows a model of a double wall carbon nanotube structure including an inner carbon nanotube and an outer carbon nanotube. When the distance between the inner nanotube and the outer nanotube is an atomic scale dimension, intershell electron transport occurs. Further, the intershell electron transport in multiwall carbon nanotubes having a wall-to-wall distance of about 0.3 nm have shown quantum conductance behavior. B. Bourlon et al., "Determination of the Intershell Conductance in Multiwalled Carbon Nanotubes," Phys. Rev. Letters, Vol. 93, No. 17, pp. 176806-1~176806-4, October (2004) disclose that the intershell transport is tunnel type and that measured intershell transmission is consistent with estimations based on the overlap between π-orbitals and neighboring shells.

Figure 3:
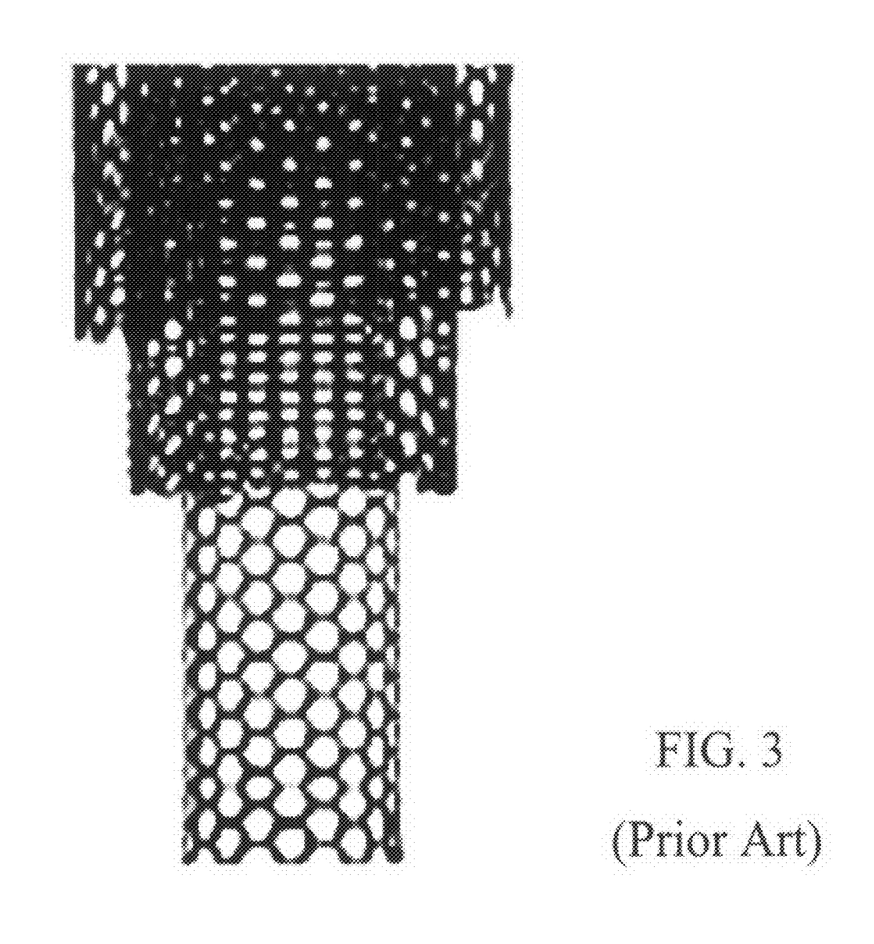
FIG. 3 is a view of a model of a multiwall carbon nanotube having three shells, which is employed as a tip of a scanning electron microscopy tool.

Another application of a carbon nanotube is its use as a tip of a scanning electron microscope. P. Liu et al., "Peeling and Cutting a Multi-Walled Carbon Nanotube inside a Scanning Electron Microscope," Proc. of the $2^{nd}$ IEEE International Conference on Nano/Micro Engineered and Molecular Systems, pp. 286-289, January (2007) discloses a method of employing an electron beam to cut individual shells, or individual carbon nanotubes, to fabricate a desired structure from a multiwall carbon nanotube structure including multiple concentric carbon nanotubes. FIG. 3 shows a tip for a scanning electron microscope that may be manufactured by the methods disclosed by P. Liu et al.

While some prototype semiconductor devices employing carbon nanotubes have been proposed as described above, the variety of available semiconductor devices based on carbon nanotubes is limited. Particularly, functional semiconductor circuitry requires other functional components including memory devices that can store information.

In view of the above, there exists a need for a carbon nanotube based memory device to enable storage of information in a carbon nanotube based semiconductor circuit, and methods of manufacturing the same.

SUMMARY OF THE INVENTION

The present invention addresses the needs described above by providing a carbon nanotube device employing three concentric carbon nanotubes that store electronic charge in a middle carbon nanotube and methods of manufacturing the same.

In the present invention, a carbon nanotube based memory device comprises a set of three concentric carbon nanotubes having different diameters. The diameters of the three concentric carbon nanotubes are selected such that an inner carbon nanotube is semiconducting, and intershell electron transport occurs between a middle carbon nanotube and each of the inner carbon nanotube and an outer carbon nanotube under a suitable voltage bias between the inner carbon nanotube and the outer carbon nanotube. Source and drain contacts are made to the inner carbon nanotube, and a gate contact is made to the outer carbon nanotube. The carbon nanotube based memory device is programmed by storing electrons or holes in the middle carbon nanotube through intershell electron transport. Changes in conductance of the inner carbon nanotube due to the charge in the middle shell are detected to determine the charge state of the middle carbon nanotube. Thus, the carbon nanotube based memory device stores information in the middle carbon nanotube in the form of electrical charge.

According to an aspect of the present invention, a carbon nanotube structure is provided, which comprises:

a set of three concentric carbon nanotubes located on a substrate, the set including:
an inner carbon nanotube having a first diameter;
a middle carbon nanotube having a second diameter, wherein the second diameter is greater than the first diameter; and
an outer carbon nanotube having a third diameter, wherein the third diameter is greater than the second diameter;
a conductive gate contact structure abutting the outer carbon nanotube;
a conductive source side contact structure abutting one side of the inner carbon nanotube; and
a conductive drain side contact structure abutting another side of the inner carbon nanotube.

In one embodiment, the inner carbon nanotube has a first length and the outer carbon nanotube has a second length, and the first length is greater than the second length.

In another embodiment, the middle carbon nanotube and the outer carbon nanotube have a same length and two pairs of vertically coincident edges.

In even another embodiment, each of a first distance between the inner carbon nanotube and the middle carbon nanotube and a second distance between the middle carbon nanotube and the outer nanotube is from about 0.2 nm to about 0.5 nm.

In yet another embodiment, a first charge tunneling rate between the inner carbon nanotube and the middle carbon nanotube and a second charge tunneling rate between the middle carbon nanotube and the outer carbon nanotube are not equal.

In still another embodiment, the first diameter is from about 1.0 nm to about 40 nm.

In still yet another embodiment, the substrate further comprises a dielectric layer abutting the conductive gate structure.

In a further embodiment, the conductive source side contact structure and the conductive drain side contact structure abut the dielectric layer.

In an even further embodiment, the carbon nanotube structure further comprises a protective dielectric layer laterally abutting the conductive source side contact structure and the conductive drain side contact structure and abutting the outer carbon nanotube and the inner carbon nanotube.

In a yet further embodiment, the protective dielectric layer abuts a first pair of substantially circular end walls of the middle carbon nanotube and a second pair of substantially circular end walls of the outer carbon nanotube.

In a still further embodiment, the protective dielectric layer comprises one of a dielectric oxide, a dielectric nitride, and a dielectric polymer.

According to another aspect of the present invention, a method of operating a carbon nanotube structure is provided. The method comprises:

providing a carbon nanotube structure including:
a set of three concentric carbon nanotubes located on a substrate, the set including:
an inner carbon nanotube having a first diameter;
a middle carbon nanotube having a second diameter, wherein the second diameter is greater than the first diameter; and
an outer carbon nanotube having a third diameter, wherein the third diameter is greater than the second diameter;
a conductive gate contact structure abutting the outer carbon nanotube;
a conductive source side contact structure abutting one side of the inner carbon nanotube; and
a conductive drain side contact structure abutting another side of the inner carbon nanotube;
storing an electrical charge in the middle carbon nanotube; and
measuring electrical characteristics of the carbon nanotube structure, wherein the electrical characteristics of the carbon nanotube structure is affected by an amount of the electrical charge in the middle carbon nanotube.

In one embodiment, the electrical charge is stored in the middle carbon nanotube by applying a voltage bias across the inner carbon nanotube and the outer carbon nanotube.

In another embodiment, a first charge tunneling rate between the inner carbon nanotube and the middle carbon nanotube and a second charge tunneling rate between the middle carbon nanotube and the outer carbon nanotube are not equal.

In yet another embodiment, the electrical characteristics of the carbon nanotube structure is transconductance of the inner carbon nanotube.

In still another embodiment, the electrical characteristics of the carbon nanotube structure is a threshold voltage of the carbon nanotube structure.

According to yet another aspect of the present invention, a method of forming a carbon nanotube structure is provided, which comprises:

forming set of three concentric carbon nanotubes on a substrate, the set including:
an inner carbon nanotube having a first diameter;
a middle carbon nanotube having a second diameter, wherein the second diameter is greater than the first diameter; and
an outer carbon nanotube having a third diameter, wherein the third diameter is greater than the second diameter;
forming a conductive gate contact structure directly on the outer carbon nanotube;
forming a conductive source side contact structure directly on one side of the inner carbon nanotube; and
forming a conductive drain side contact structure directly on another side of the inner carbon nanotube.

In one embodiment, the method further comprises cutting the outer carbon nanotube and the middle carbon nanotube, wherein the middle carbon nanotube and the outer carbon nanotube have a same length and two vertically coincident pairs of edges after the cutting, and wherein the inner carbon nanotube protrudes out from each of the two vertically coincident pairs of edges.

In another embodiment, the method further comprises forming a protective dielectric layer over the substrate and the set of three concentric carbon nanotubes.

In yet another embodiment, the method further comprises patterning the protective dielectric layer to expose two end portions of the inner carbon nanotube, wherein the conductive source side contact structure and the drain side contact structure are formed directly on the two end portions of the inner carbon nanotube.

DETAILED DESCRIPTION OF THE INVENTION

As stated above, the present invention relates to a multiwall carbon nanotube memory device and methods of manufacturing the same, which are now described in detail with accompanying figures. It is noted that like and corresponding elements are referred to by like reference numerals.

Figure 4:
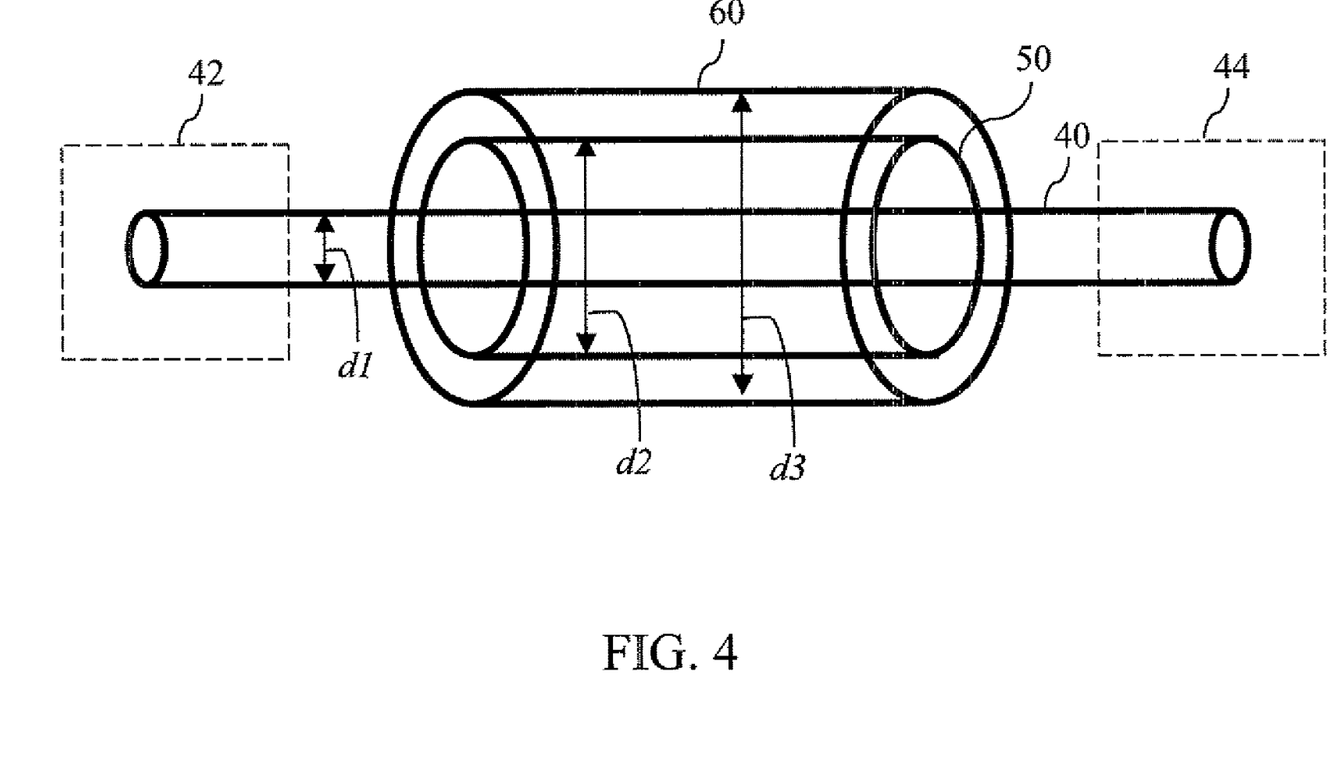
FIG. 4 is a schematic view of a set of three concentric carbon nanotubes according to the present invention.

Referring to FIG. 4, a set of three concentric carbon nanotubes is shown, which is employed to form a carbon nanotube structure according to the present invention. The set of three carbon nanotubes comprises an inner carbon nanotube 40 having a first diameter d1, a middle carbon nanotube 50 having a second diameter d2, and an outer carbon nanotube 60 having a third diameter d3. The first diameter d1 is from about 1.0 nm to about 40 nm, and preferably from about 1.3 nm to about 10 nm, and more preferably from about 1.7 nm to about 4.0 nm. Preferably, the inner carbon nanotube 40 is semiconducting.

The second diameter d2 is greater than the first diameter d1, and the third diameter d3 is greater than the second diameter d2. The difference between the second diameter d2 and the first diameter d1 may be from about 0.4 nm to about 1.0 nm, i.e., the middle carbon nanotube 50 and the inner carbon nanotube 40 are separated by a distance from about 0.2 nm to about 0.5 nm. The difference between the third diameter d3 and the second diameter d2 may be from about 0.4 nm to about 1.0 nm, i.e., the outer carbon nanotube 60 and the middle carbon nanotube 50 are separated by a distance from about 0.2 nm to about 0.5 nm. Once formed, the set of three carbon nanotubes maintains concentricity among the three carbon nanotubes due to Van der Waals force between adjacent carbon nanotubes.

Preferably, the distance between the inner carbon nanotube 40 and the middle carbon nanotube 50 is tuned to provide electrical charge tunneling between them at a first tunneling rate. Likewise, the distance between the middle carbon nanotube 50 and the outer carbon nanotube is tuned to provide electrical charge tunneling between them at a second charge tunneling rate. Preferably, the first charge tunneling rate and the second charge tunneling rate are not equal for a given voltage bias between the middle carbon nanotube 50 and the inner carbon nanotube 40 or the outer carbon nanotube 60.

Two end portions of the inner carbon nanotube 40 protrude out from the edges of the middle carbon nanotube 50 and the outer carbon nanotube 60. A source side contact structure (not shown) is formed directly on a first protruding portion 42 of the inner carbon nanotube 40 on one side, and a drain side contact structure (not shown) is formed directly on a second protruding portion 44 of the inner carbon nanotube 40 on the other side. A gate contact structure (not shown) is formed directly on the outer carbon nanotube.

Charge is stored in the middle carbon nanotube 50 by applying an electrical bias between the inner carbon nanotube 40 and the outer carbon nanotube 60. The asymmetry between the first tunneling rate and the second tunneling rate induces charge in the middle carbon nanotube. The waveform of the electrical bias may be a constant voltage pulse having an on state and an off state, or may have a time dependent waveform such as a sawtooth waveform. The amount of charge stored in the middle carbon nanotube stores information that is programmable and erasable. The information is "read" or detected by operating the set of three concentric carbon nanotube as a semiconductor device. Specifically, by applying an electrical bias between the first protruding portion 42 and the second protruding portion 44 and another electrical bias to the outer carbon nanotube 60, the transconductance of the inner carbon nanotube 40 or the threshold voltage, i.e., the voltage bias needed on the outer carbon nanotube 60 to induce a predefined significant level of current, is measured. The value of the measured parameters indicates the amount of charge in the middle carbon nanotube 50. The information stored in the middle carbon nanotube may be binary or may be a base greater than 2, i.e., may be ternary, quaternary, etc.

Figure 5:
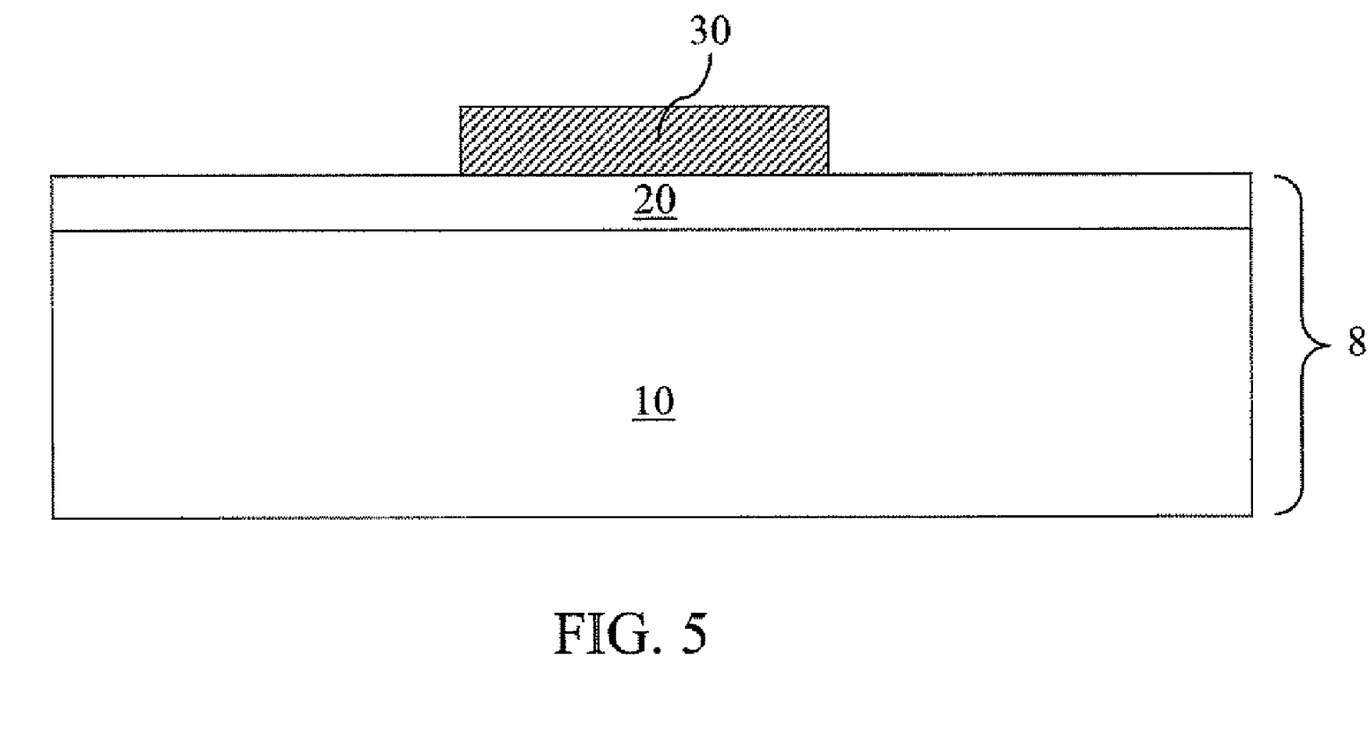
FIGS. 5-10 are sequential vertical cross-sectional views of an exemplary carbon nanotube structure according to the present invention in a vertical plane along a lengthwise direction of a set of three concentric carbon nanotubes.

Referring to FIG. 5, a vertical cross-sectional view of an exemplary carbon nanotube structure according to the present invention at an initial manufacturing step is shown. The exemplary carbon nanotube structure comprises a conductive gate contact structure 30 formed on a substrate 8. The substrate 8 comprises a substrate layer 10 and a dielectric layer 20. The substrate layer 10 may comprise a conductor, a semiconductor, or an insulator. The dielectric layer 20 comprises a dielectric material such as a dielectric oxide, a dielectric nitride, or a dielectric polymer. For example, the dielectric material may comprise silicon oxide.

The conductive gate contact structure 30 comprises a conductive material such as a metal, a conductive metallic alloy, or a doped semiconductor material. The metal may be an elemental metal or an alloy of multiple elemental metals. Exemplary conductive metallic alloys include, but are not limited to, TaN, TiN, AlTaN, WN, and other refractory metal nitrides. The doped semiconductor material includes doped silicon, doped germanium, and doped semiconductor alloys. The conductive gate contact structure 30 may be formed by blanket deposition of a conductive layer on the dielectric layer 20, followed by patterning of the conductive layer. The patterning may employ lithographic methods and an etch, such as an anisotropic dry etch or a wet etch. The thickness of the conductive gate contact structure 30 may be from about 3 nm to about 300 nm, and typically from about 10 nm to about 100 nm, although lesser and greater thicknesses are explicitly contemplated herein.

Figure 6:
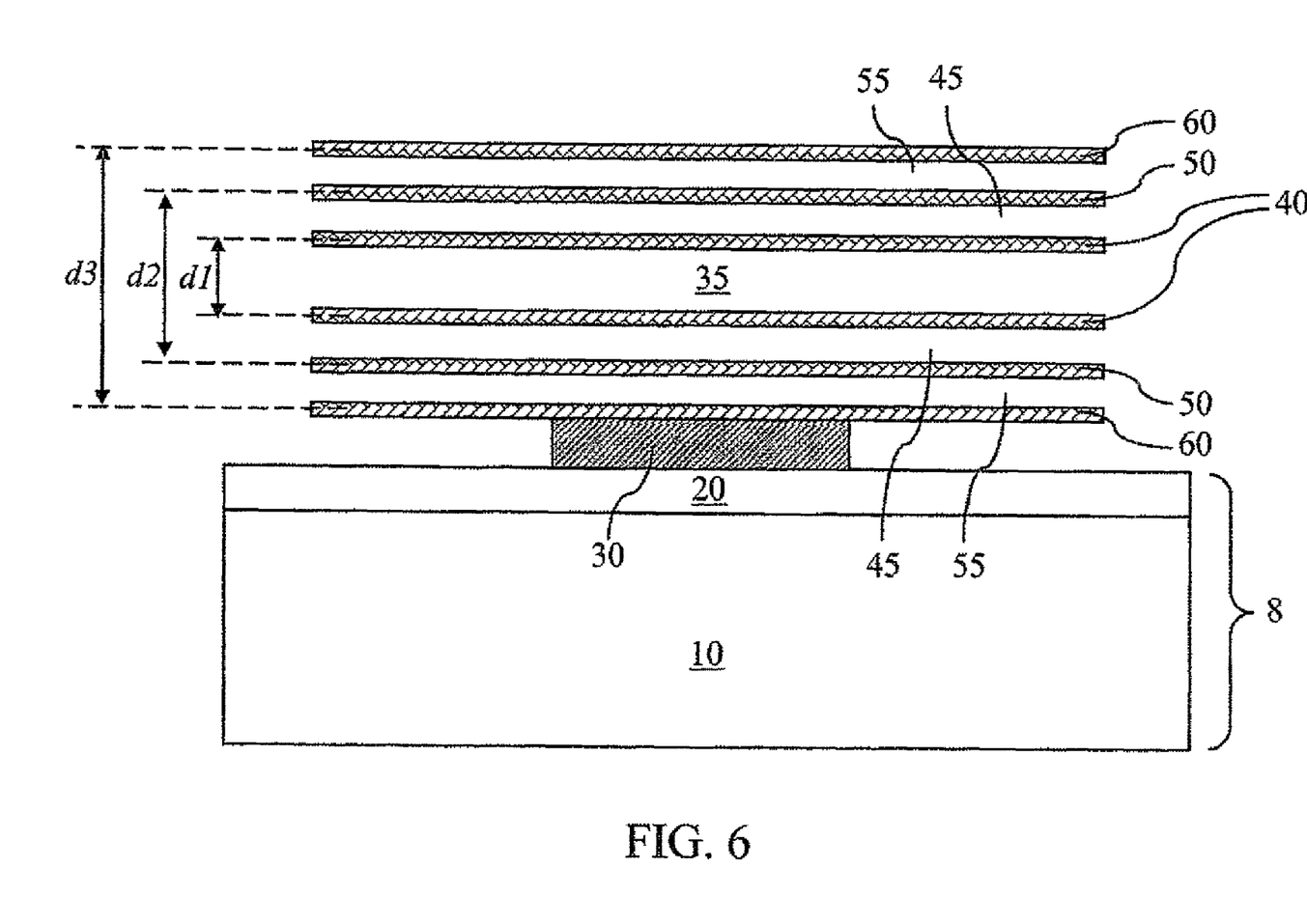

Referring to FIG. 6, a set of three concentric carbon nanotubes is thereafter placed on the conductive gate contact structure 30. The set of three concentric carbon nanotubes comprises an inner carbon nanotube 40, a middle carbon nanotube 50, and an outer carbon nanotube 60. The set of three concentric carbon nanotubes may be provided by methods known in the art. For example, methods of providing multiwall carbon nanotube structures as described in B. Bourlon et al. or P. Liu et al. (vide supra) may be utilized to provide the set of three concentric carbon nanotubes. The inner carbon nanotube 40 has a first diameter d1, the middle diameter 50 has a second diameter d2, and the outer carbon nanotube 60 has a third diameter d3, each of which satisfies the conditions of the first diameter d1, the second diameter d2, and the third diameter d3 of the set of three concentric carbon nanotubes described in FIG. 4.

An inner-tube-enclosed space 35 is the cylindrical space enclosed by the inner carbon nanotube 40. A first inter-carbon-nanotube space 45 is the annular and cylindrical space between the inner carbon nanotube 40 and the middle carbon nanotube 50. A second inter-carbon-nanotube space 55 is the annular and cylindrical spacer between the middle carbon nanotube 50 and the outer carbon nanotube 60. The inner-tube-enclosed space 35, the first inter-carbon-nanotube space 45, and the second inter-carbon-nanotube space 55 are concentric and have a cylindrical symmetry.

The inner carbon nanotube 40, a middle carbon nanotube 50, and an outer carbon nanotube 60 may, or may not, have a same length at this point. Preferably, the outer carbon nanotube 60 extends beyond a lateral dimension of the conductive gate contact structure 30.

While formation of the conductive gate contact structure 30 precedes placement of the set of three concentric carbon nanotubes in the description of the present invention, formation and patterning of a conductive gate contact structure after the placement of the set of three concentric carbon nanotubes is also explicitly contemplated herein.

Figure 7:
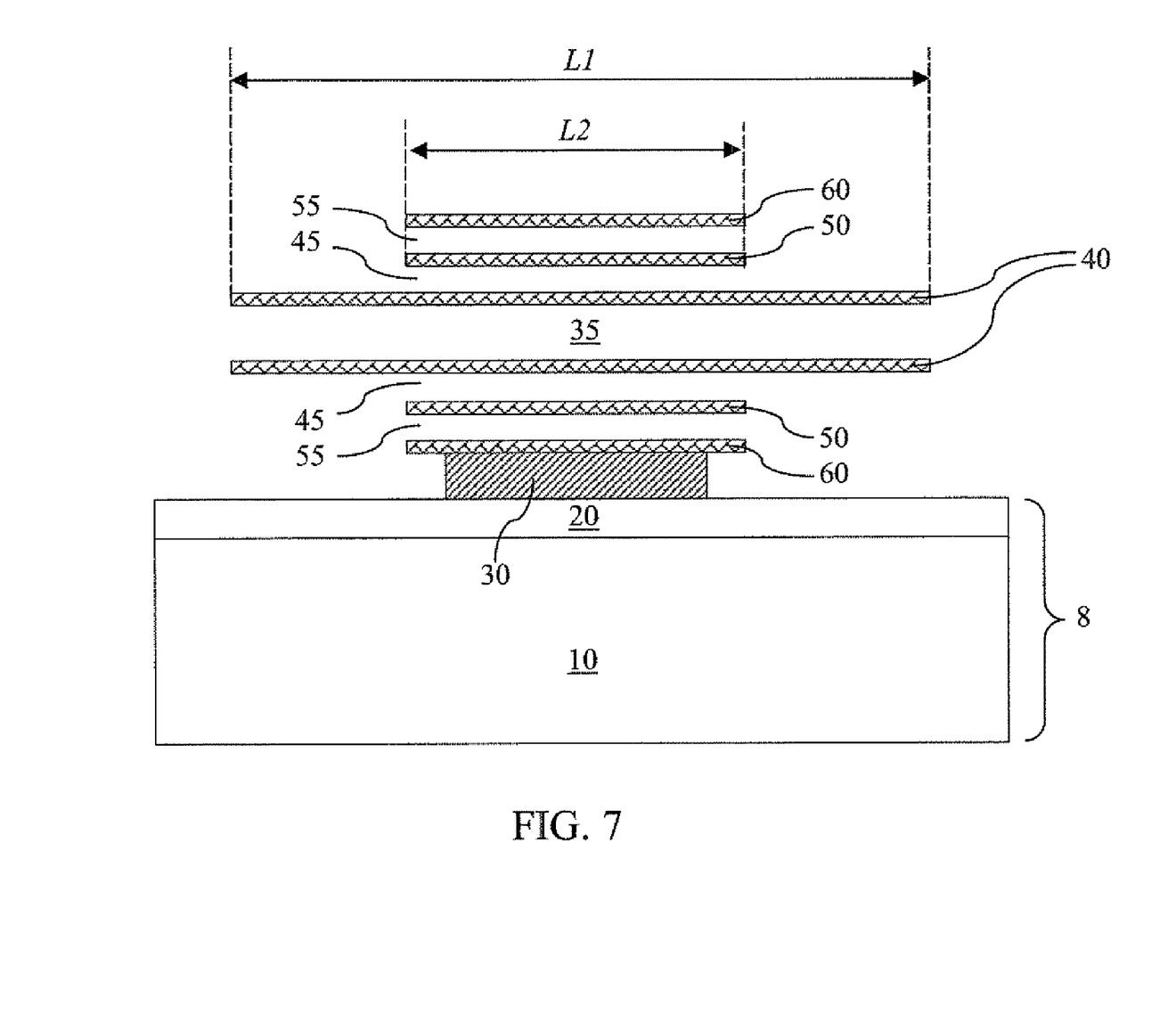

Referring to FIG. 7, the lengths of the outer carbon nanotube 60 and the middle carbon nanotube 50 are adjusted as necessary so that two end portions of the inner carbon nanotube 40 protrude outside the edges of the middle carbon nanotube 50 and the outer carbon nanotube 60. The adjustment of the lengths of the middle carbon nanotube 50 and the outer carbon nanotube 60 may be effected by cutting end portions of each of the middle carbon nanotube 50 and the outer carbon nanotube 60 with a laser beam, an electron beam, or an ion beam. The end portions thus cut off are removed.

Preferably, the edges of the middle carbon nanotube 50 and the outer carbon nanotube 60 are made to be vertically coincident at both ends of the middle carbon nanotube 50 and the outer carbon nanotube 60. Thus, the middle carbon nanotube 50 and the outer carbon nanotube 60 have a same length, which is herein referred to as a second length L2, and two pairs of vertically coincident edges, i.e., a first pair of vertically coincident edges on one side and a second pair of vertically coincident edges on the other side. The second length L2 may be from about 5 nm to about 1,000 nm, and typically from about 20 nm to about 200 nm.

The inner carbon nanotube 40 protrudes out of each pair of vertically coincident edges. Thus, the length of the inner carbon nanotube 40, which is herein referred to as a first length L1, is greater than the second length L2.

While the lengths of the middle carbon nanotube 50 and the outer carbon nanotube are adjusted after placement on the conductive gate contact structure 30 in the description of the present invention, adjustment of the lengths of the middle carbon nanotube 50 and the outer carbon nanotube prior to the placement of the set of the three carbon nanotubes (40, 50, 60) on the conductive gate contact structure is also explicitly contemplated herein.

Figure 8:
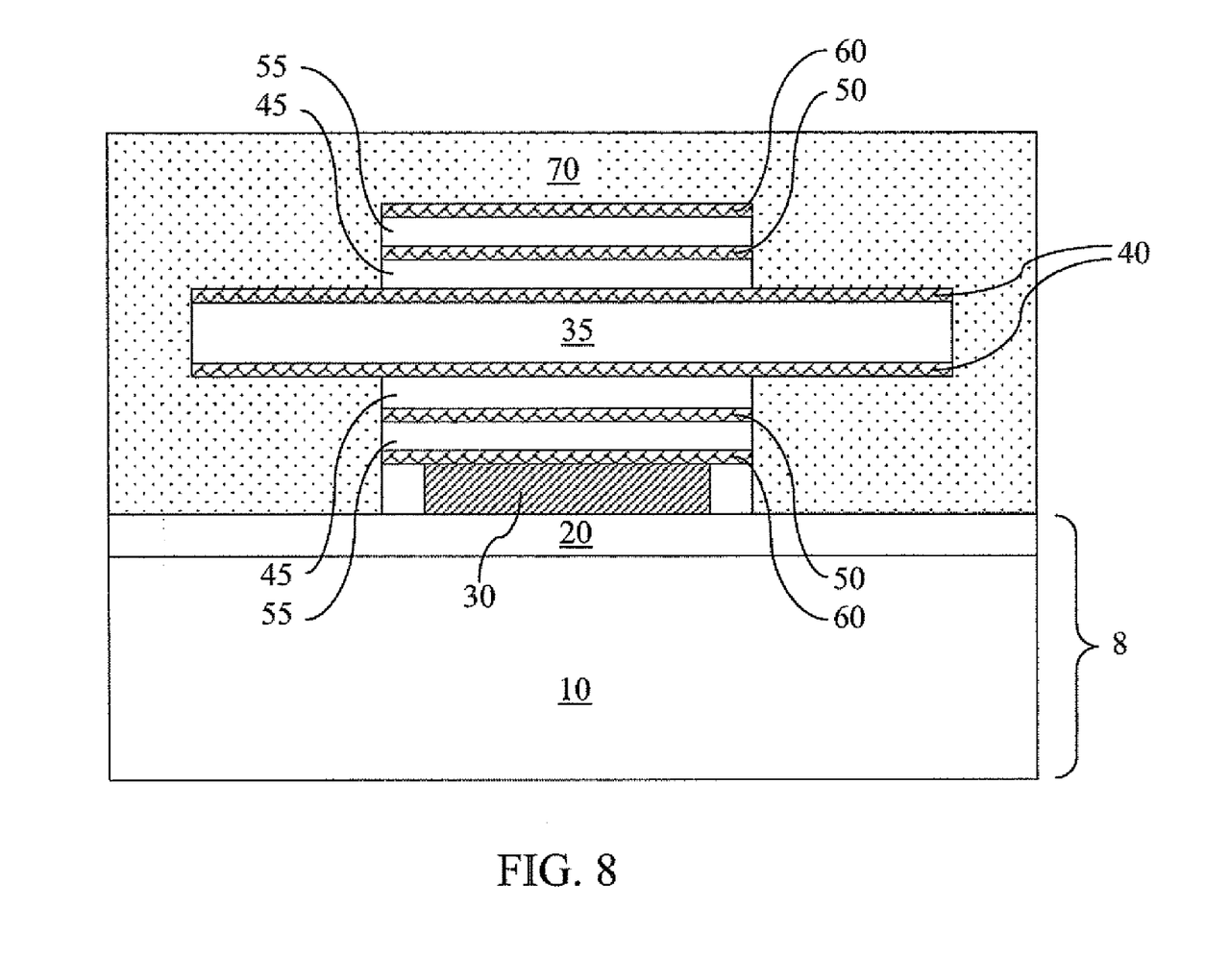

Referring to FIG. 8, a protective dielectric layer 70 is formed over the set of the three concentric carbon nanotubes (40, 50, 60) and the dielectric layer 20. The protective dielectric layer 70 may comprise one of a dielectric oxide, a dielectric nitride, and a dielectric polymer. Exemplary materials for the dielectric oxide include various silicon oxides including doped or undoped silicate glass formed by chemical vapor deposition (CVD) or spin-on coating and curing. Exemplary materials for the dielectric nitride include silicon nitride. Exemplary materials for the dielectric polymer include, but are not limited to, various polymethylmethacrylates (PMMAs), polyisoprenes, polybutadienes, polyvinylpyridines, polyethyleneoxides, polyethylenes, polyorganosilicates, polyferrocenyldimethylsilanes, etc.

The protective dielectric layer 70 has a thickness that exceeds the sum of the thickness of the conductive gate contact structure 30 and the third diameter d3 (See FIG. 6), which is the diameter of the outer carbon nanotube 60. The protective dielectric layer 70 protects the set of the three concentric carbon nanotubes (40, 50, 60) from exposure to oxidants, moisture, and other contaminants as well as providing electrical isolation among conductive components to be subsequently formed. The protective dielectric layer 70 may, or may not, be planarized by any recess etch or other planarization methods.

Figure 9:
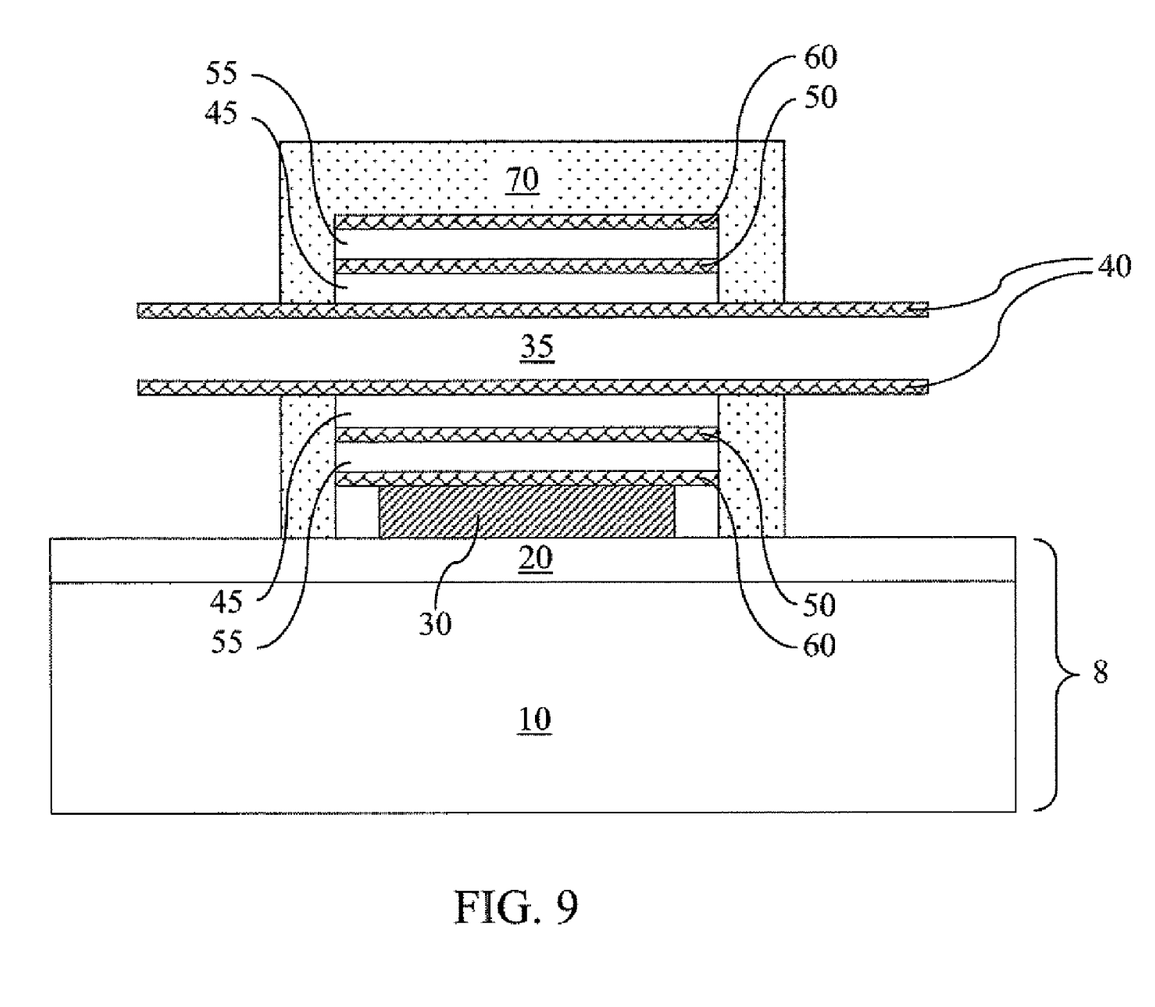

Referring to FIG. 9, the protective dielectric layer 70 is patterned to expose both ends of the inner carbon nanotube 40. Preferably, the outer carbon nanotube 60 and the middle carbon nanotube 50 are not exposed. The patterning of the protective dielectric layer 70 may be effected by lithographic methods employing a photoresist (not shown) followed by an etch, which may be a wet etch or an anisotropic dry etch such as a reactive ion etch. The etch is selective to the inner carbon nanotube 40. Optionally, a portion of the conductive gate contact structure 30 may be exposed at this step.

Figure 10:
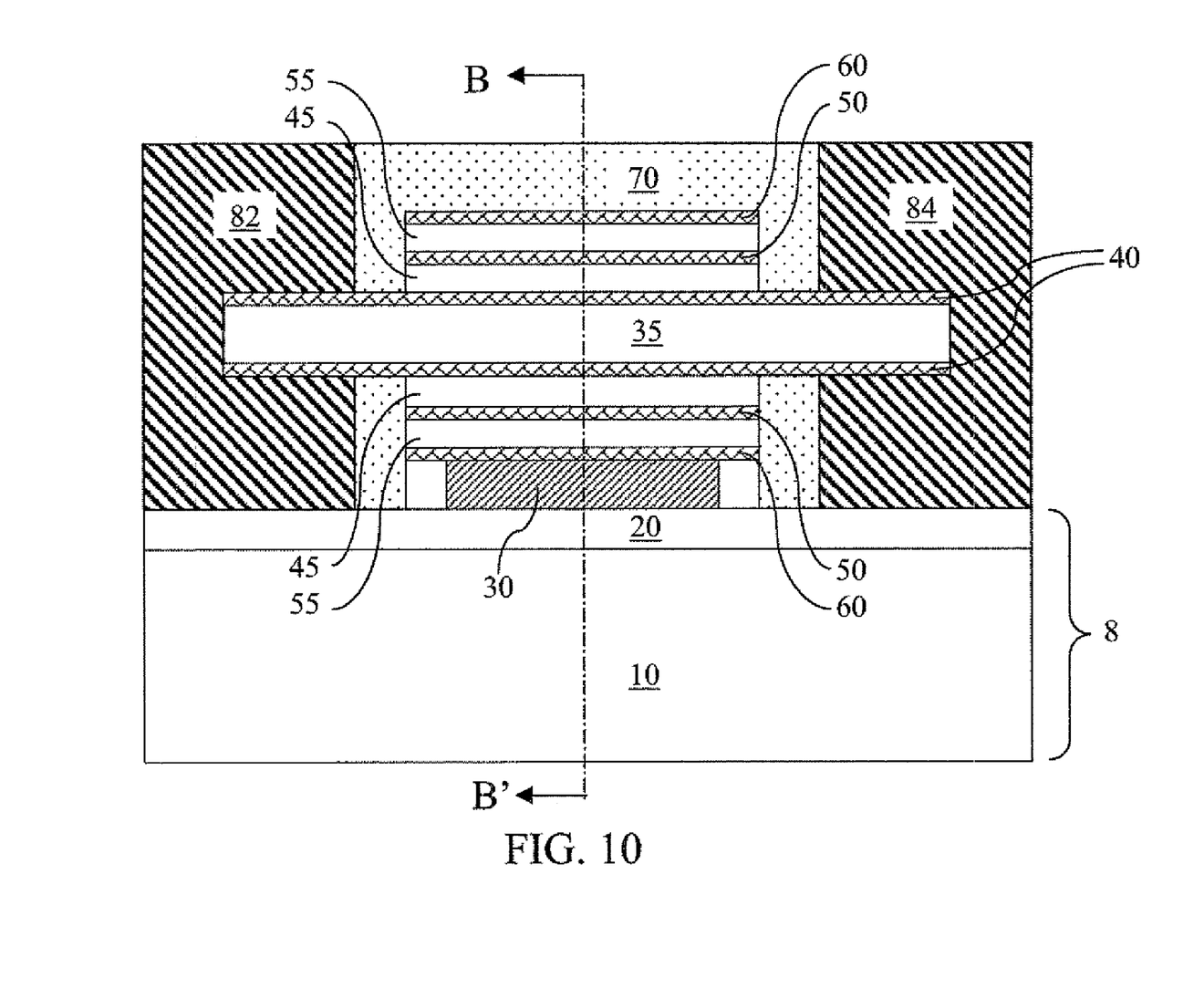
Figure 11:
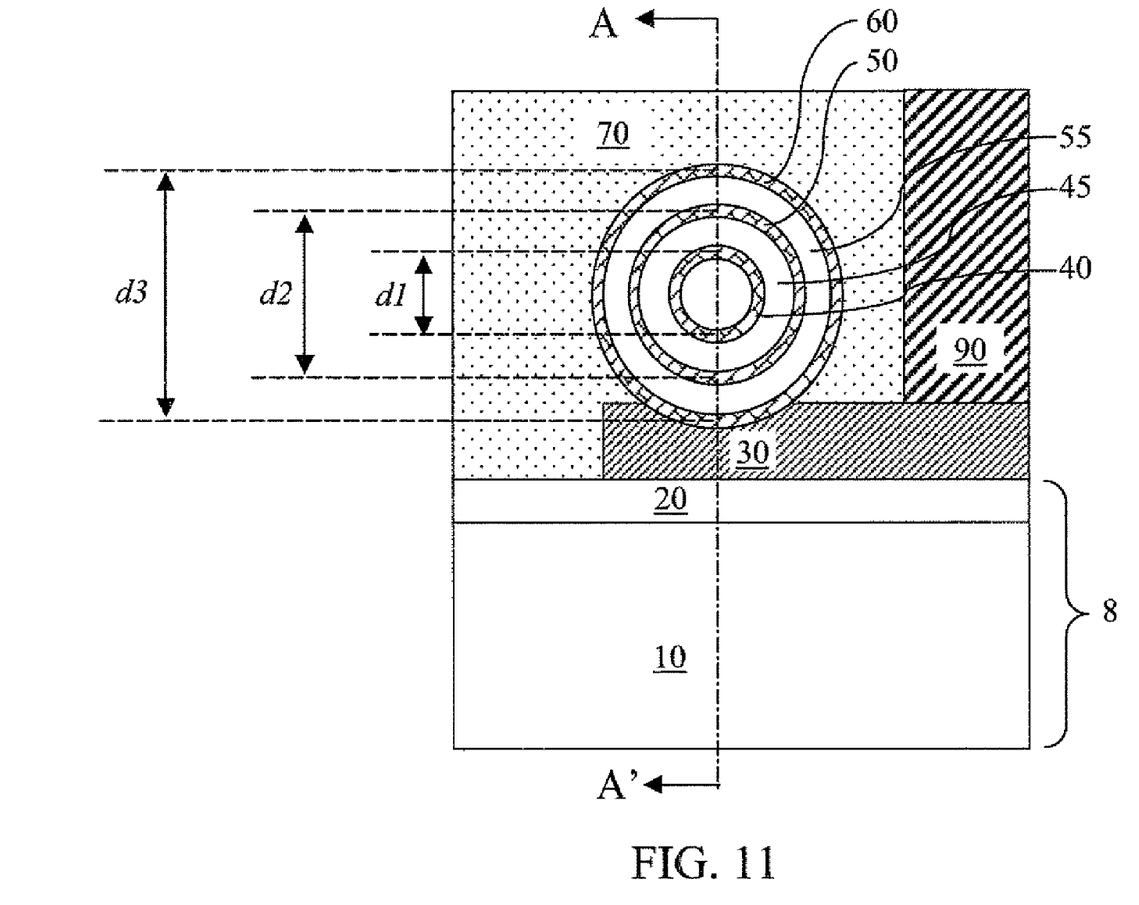
FIG. 11 is a vertical cross-sectional view of the carbon nanotube structure of FIG. 10 along the plane B-B'. The plane A-A' corresponds to the plane of the vertical cross-sectional view of FIG. 10.

Referring to FIGS. 10 and 11, vertical cross-sectional views of the exemplary semiconductor structure are shown such that FIG. 10 shows a vertical cross-sectional view along the lengthwise direction the inner carbon nanotube 40 and including a diameter of the inner carbon nanotube 40, and FIG. 11 shows another vertical cross-sectional view perpendicular to the lengthwise direction of the inner carbon nanotube 40. A conductive material is deposited on the inner carbon nanotube 40 and, if present, an exposed portion of the conductive gate contact structure 30. A portion of the conductive material that is formed directly on a first end of the inner carbon nanotube 40 constitutes a conductive source side contact structure 82. Another portion of the conductive material that is formed directly on a second end of the inner carbon nanotube 40 constitutes a conductive drain side contact structure 84. If any exposed portion of the conductive gate contact structure 30 is present, yet another portion of the conductive material that is formed directly on the exposed portion of the conductive gate contact structure 30 constitutes a conductive gate contact structure extension 90.

The exemplary carbon nanotube structure functions as a field effect transistor having a floating gate to store charges that affect the characteristics of the device. Particularly, the first end of the inner carbon nanotube 40 having the conductive source side contact structure 82 functions as a source of a transistor. The second end of the inner carbon nanotube 40 having the conductive drain side contact structure 84 functions as a drain of the transistor. The outer carbon nanotube 60 functions as a gate of the transistor. Thus, depending on the bias voltage across the conductive drain side contact structure 84 and the conductive source side contact structure 82 and the bias voltage between the outer carbon nanotube 60 and the conductive source side contact structure 82, the transconductance and the current through the inner carbon nanotube 40 changes.

However, the exemplary carbon nanotube structure further comprises a "floating gate," which comprises the middle carbon nanotube 50. Due to the overlap of π-orbitals between adjacent carbon nanotubes, i.e., between the middle carbon nanotube 50 and each of the inner carbon nanotube 40 and the outer carbon nanotube 60, charge tunneling occurs between adjacent carbon nanotubes when a voltage bias is applied across an adjacent pair of carbon nanotubes. Preferably, a first charge tunneling rate between the inner carbon nanotube 40 and the middle carbon nanotube 50 and a second charge tunneling rate between the middle carbon nanotube 50 and the outer carbon nanotube 60 are different under identical voltage bias. The various diameters (d1, d2, d3) of the carbon nanotubes (40, 50, 60) may be tuned such that the ratio between the first charge tunneling rate and the second charge tunneling rate is between 0.0001 and 1 or between 1 and 10,000 under identical voltage bias conditions. The asymmetry between the first charge tunneling rate and the second charge tunneling rate is advantageously employed to store a charge in the middle carbon nanotube 50.

To store electrical charges in the middle carbon nanotube 50, a voltage bias is applied between the conductive gate contact structure 30 and the conductive source side contact structure 82. The same voltage may be applied to the drain side contact structure 84, or alternately, the drain side contact structure 84 may be left floating. The voltage bias between the outer carbon nanotube 60 and the inner carbon nanotube 40 induces a first tunneling current between the inner carbon nanotube 40 and the middle carbon nanotube 50 and a second tunneling current between the middle carbon nanotube 50 and the outer carbon nanotube 60. A transient imbalance between the first tunneling current and the second tunneling current induces electrical charges in the middle carbon nanotube. The stored electrical charges may be positive or negative, i.e., holes may be stored or electrons may be stored in the middle carbon nanotube 50.

The amount of charge, in addition to presence or absence of charge, in the middle carbon nanotube 50, which functions as the floating gate, alters electrical characteristics of the transistor such as the transconductance and the current through the inner carbon nanotube 40. Thus, by altering the amount of charge stores in the middle carbon nanotube 50, information may be stored in the exemplary carbon nanotube structure, i.e., the exemplary carbon nanotube structure functions as a memory device.

The exemplary carbon nanotube structure may be employed to store a binary bit of information by operating the middle carbon nanotube 50 between two states, i.e., a charged state and an uncharged state. The charged state may store electrons or holes in the middle carbon nanotube.

Alternately, the exemplary carbon nanotube structure may be employed to store a ternary bit of information by operating the middle carbon nanotube 50 between three states, for example, a state charged with electrons, an uncharged state, and a state charged with holes, i.e., a state in which electrons are transferred out of the middle carbon nanotube 50.

Yet alternately, the exemplary carbon nanotube structure may be employed to store information having a base greater than 3 by changing the amount of charge stored in the middle carbon nanotube 50, and optionally, by changing the polarity of the charge stored in the middle carbon nanotube 50.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations, which fall within the scope and spirit of the invention and the following claims.

What is claimed is:

1. A carbon nanotube structure comprising:
   a set of three concentric carbon nanotubes located on a substrate, said set including:
   an inner carbon nanotube having a first diameter;
   a middle carbon nanotube having a second diameter, wherein said second diameter is greater than said first diameter; and
   an outer carbon nanotube having a third diameter, wherein said third diameter is greater than said second diameter;
   a conductive gate contact structure abutting said outer carbon nanotube;
   a conductive source side contact structure abutting one side of said inner carbon nanotube; and
   a conductive drain side contact structure abutting another side of said inner carbon nanotube.

2. The carbon nanotube structure of claim 1, wherein said inner carbon nanotube has a first length and said outer carbon nanotube has a second length, and wherein said first length is greater than said second length.

3. The carbon nanotube structure of claim 1, wherein said middle carbon nanotube and said outer carbon nanotube have a same length and two pairs of vertically coincident edges.

4. The carbon nanotube structure of claim 1, wherein each of a first distance between said inner carbon nanotube and said middle carbon nanotube and a second distance between said middle carbon nanotube and said outer nanotube is from about 0.2 nm to about 0.5 nm.

5. The carbon nanotube structure of claim 1, wherein a first charge tunneling rate between said inner carbon nanotube and said middle carbon nanotube and a second charge tunneling rate between said middle carbon nanotube and said outer carbon nanotube are not equal.

6. The carbon nanotube structure of claim 1, wherein said first diameter is from about 1.0 nm to about 40 nm.

7. The carbon nanotube structure of claim 1, wherein said substrate further comprises a dielectric layer abutting said conductive gate structure.

8. The carbon nanotube structure of claim 7, wherein said conductive source side contact structure and said conductive drain side contact structure abut said dielectric layer.

9. The carbon nanotube structure of claim 1, further comprising a protective dielectric layer laterally abutting said conductive source side contact structure and said conductive drain side contact structure and abutting said outer carbon nanotube and said inner carbon nanotube.

10. The carbon nanotube structure of claim 8, wherein said protective dielectric layer abuts a first pair of substantially circular end walls of said middle carbon nanotube and a second pair of substantially circular end walls of said outer carbon nanotube.

11. The carbon nanotube structure of claim 1, wherein said protective dielectric layer comprises one of a dielectric oxide, a dielectric nitride, and a dielectric polymer.

12. A method of operating a carbon nanotube structure, said method comprising:
  providing a carbon nanotube structure including:
    a set of three concentric carbon nanotubes located on a substrate, said set including:
      an inner carbon nanotube having a first diameter;
      a middle carbon nanotube having a second diameter, wherein said second diameter is greater than said first diameter; and
      an outer carbon nanotube having a third diameter, wherein said third diameter is greater than said second diameter;
    a conductive gate contact structure abutting said outer carbon nanotube;
    a conductive source side contact structure abutting one side of said inner carbon nanotube; and
    a conductive drain side contact structure abutting another side of said inner carbon nanotube;
  storing an electrical charge in said middle carbon nanotube; and
  measuring electrical characteristics of said carbon nanotube structure, wherein said electrical characteristics of said carbon nanotube structure is affected by an amount of said electrical charge in said middle carbon nanotube.

13. The method of claim 11, wherein said electrical charge is stored in said middle carbon nanotube by applying a voltage bias across said inner carbon nanotube and said outer carbon nanotube.

14. The method of claim 11, wherein a first charge tunneling rate between said inner carbon nanotube and said middle carbon nanotube and a second charge tunneling rate between said middle carbon nanotube and said outer carbon nanotube are not equal.

15. The method of claim 11, wherein said electrical characteristics of said carbon nanotube structure is transconductance of said inner carbon nanotube.

16. The method of claim 11, wherein said electrical characteristics of said carbon nanotube structure is a threshold voltage of said carbon nanotube structure.

17. A method of forming a carbon nanotube structure comprising:
  forming set of three concentric carbon nanotubes on a substrate, said set including:
    an inner carbon nanotube having a first diameter;
    a middle carbon nanotube having a second diameter, wherein said second diameter is greater than said first diameter; and
    an outer carbon nanotube having a third diameter, wherein said third diameter is greater than said second diameter;
  forming a conductive gate contact structure directly on said outer carbon nanotube;
  forming a conductive source side contact structure directly on one side of said inner carbon nanotube; and
  forming a conductive drain side contact structure directly on another side of said inner carbon nanotube.

18. The method of claim 17, further comprising cutting said outer carbon nanotube and said middle carbon nanotube, wherein said middle carbon nanotube and said outer carbon nanotube have a same length and two vertically coincident pairs of edges after said cutting, and wherein said inner carbon nanotube protrudes out from each of said two vertically coincident pairs of edges.

19. The method of claim 17, further comprising forming a protective dielectric layer over said substrate and said set of three concentric carbon nanotubes.

20. The method of claim 19, further comprising patterning said protective dielectric layer to expose two end portions of said inner carbon nanotube, wherein said conductive source side contact structure and said drain side contact structure are formed directly on said two end portions of said inner carbon nanotube.

* * * * *